(12) United States Patent
Jhang-Jian et al.

(10) Patent No.: US 12,224,784 B2
(45) Date of Patent: Feb. 11, 2025

(54) SIGNAL ADJUSTING CIRCUIT AND RECEIVING END CIRCUIT USING THE SAME

(71) Applicant: REALTEK SEMICONDUCTOR CORP., Hsinchu (TW)

(72) Inventors: Sie-Siou Jhang-Jian, Hsinchu (TW); Hsuan-Yi Su, Hsinchu (TW); Chih-Lung Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 448 days.

(21) Appl. No.: 17/870,939

(22) Filed: Jul. 22, 2022

(65) Prior Publication Data

US 2023/0117775 A1    Apr. 20, 2023

(30) Foreign Application Priority Data

Oct. 20, 2021   (TW) ................. 110138810

(51) Int. Cl.
*H04B 1/10*    (2006.01)
*H03G 3/30*    (2006.01)
(Continued)

(52) U.S. Cl.
CPC ......... *H04B 1/1027* (2013.01); *H03G 3/3036* (2013.01); *H04B 1/123* (2013.01); *H04B 1/1607* (2013.01)

(58) Field of Classification Search
CPC .......... H04B 1/06; H04B 1/1027; H04B 1/12; H04B 1/123; H04B 1/16; H04B 1/1607;
(Continued)

(56) References Cited

U.S. PATENT DOCUMENTS 9,178,474 B2 *  11/2015  Lee ..................... H03G 3/3084
9,673,779 B2 *   6/2017  Ruile .................. H03H 9/1457
(Continued)

OTHER PUBLICATIONS

Shang-Hsien Yang, Chua-Chin Wang, "Feed-forward Output Swing Prediction AGC with Parallel-Detect Singular-Store Peak Detector", Department of Electrical Engineering, National Sun Yat-Sen University 2012 IEEE, pp. 2965-2968.
(Continued)

*Primary Examiner* — Quochien B Vuong
(74) *Attorney, Agent, or Firm* — Li & Cai Intellectual Property (USA) Office (57) ABSTRACT

A signal adjusting circuit and a receiving end circuit using the same are provided. The signal adjusting circuit is adapted to a peak detector, and includes a first amplifier and a first feedback circuit. The first amplifier receives a first input signal, and amplifies the first input signal to output a first output signal. The first feedback circuit is connected between a first input terminal and a first output terminal of the first amplifier, and is configured to determine a first gain of the first output signal. The peak detector is connected to a first output node of the first feedback circuit, so as to receive a first detection signal and detect a peak value of the first detection signal. The peak detector has a predetermined power input range, and the first feedback circuit keeps the first detection signal within the predetermined power input range.

13 Claims, 5 Drawing Sheets (51) Int. Cl.
*H04B 1/12* (2006.01)
*H04B 1/16* (2006.01)

(58) Field of Classification Search
CPC .......... H03G 3/20; H03G 3/30; H03G 3/3005; H03G 3/301; H03G 3/3036
See application file for complete search history.

(56) References Cited

U.S. PATENT DOCUMENTS

| | | | |
|---|---|---|---|
| 10,263,582 B1 * | 4/2019 | Yoo | H03G 3/3031 |
| 10,819,425 B2 * | 10/2020 | Tanaka | H04B 10/695 |
| 2016/0142026 A1 | 5/2016 | Kim | |

OTHER PUBLICATIONS

Shuo Li, Hao Xue, Xiaomeng Zhang, Saiyu Ren, "A Low Power CMOS Amplitude Peak Detector for On-chip Self-calibration Applications", 2017 IEEE, pp. 323-326.

* cited by examiner

SIGNAL ADJUSTING CIRCUIT AND RECEIVING END CIRCUIT USING THE SAME

CROSS-REFERENCE TO RELATED PATENT APPLICATION

This application claims the benefit of priority to Taiwan Patent Application No. 110138810, filed on Oct. 20, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a signal adjusting circuit and a receiving end circuit using the same, and more particularly to a signal adjusting circuit and a receiving end circuit using the same that can adapt to a peak detector without using additional components.

BACKGROUND OF THE DISCLOSURE

In a conventional receiving end circuit, since a peak detector (PD) is often used to detect whether a peak value of an input signal exceeds a predetermined range, signal integrity cannot be maintained.

For example, if the peak detector is applied to detect an output signal of a transimpedance amplifier (TIA) under a well-designed condition in which the output signal of the transimpedance amplifier has good linearity and is close to a limit of a supply voltage, an additional attenuator needs to be used. However, using more components can result in increased mismatches.

Alternatively, the peak detector can be set at an input terminal of the transimpedance amplifier for detection. However, since the signal needs to be detected before amplification, an additional preamplifier is needed for the peak detector to operate properly, which can cause a variation of the to-be-detected signal to increase.

SUMMARY OF THE DISCLOSURE

In response to the above-referenced technical inadequacies, the present disclosure provides a signal adjusting circuit and a receiving end circuit using the same that can adapt to a peak detector without using additional components.

In one aspect, the present disclosure provides a signal adjusting circuit adapted to a peak detector. The signal adjusting circuit includes a first amplifier and a first feedback circuit. The first amplifier includes a first input terminal and a first output terminal, in which the first input terminal receives a first input signal, and the first amplifier is configured to amplify the first input signal and output a first output signal from the first output terminal. The first feedback circuit includes a first capacitor, a first resistor, and a second resistor. The first capacitor is connected between the first input terminal and the first output terminal. The first resistor is connected between the first input terminal and a first output node. The second resistor is connected between the first output node and the first output terminal, in which the first feedback circuit is configured to determine a first gain of the first output signal. The peak detector is connected to the first output node to receive a first detection signal and detect a peak value of the first detection signal. The peak detector has a predetermined power input range, and the first resistance and the second resistance have a first predetermined ratio, such that the first detection signal has a second gain relative to the first input signal and is within the predetermined power input range.

In another aspect, the present disclosure provides a receiving end circuit including a transimpedance amplifier and a first peak detector. The transimpedance amplifier includes a first signal adjusting circuit, which includes a first amplifier, a first feedback circuit, and a first control circuit. The first amplifier includes a first input terminal and a first output terminal, in which the first input terminal receives a first input signal, and the first amplifier is configured to amplify the first input signal and output a first output signal from the first output terminal. The first feedback circuit includes a first capacitor, a first variable resistor, and a second variable resistor. The first capacitor is connected between the first input terminal and the first output terminal. The first variable resistor is connected between the first input terminal and a first output node. The second variable resistor is connected between the first output node and the first output terminal. The first control circuit is configured to control resistance values of the first variable resistor and the second variable resistor, so as to determine a first gain of the first output signal relative to the first input signal and a second gain of a detection signal relative to the first input signal. The first peak detector is connected to the first output node to receive the first detection signal, has a first predetermined power input range, and is configured to detect a peak value of the first detection signal. The first control circuit controls the resistance values of the first variable resistor and the second variable resistor to have a first predetermined ratio, such that the first detection signal is within the first predetermined power input range.

Therefore, the signal adjusting circuit and the receiving end circuit using the same provided by the present disclosure can cooperate with the transimpedance amplifier or a baseband filter in the receiving end circuit, and can be adapted to a receiving end peak detector without an area increase and use of an additional attenuator or preamplifier. In this way, mismatches caused by use of the above-mentioned additional components can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like. In addition, in this document, the term "connected" can be used to indicate that two or more elements make physical or electrical contact with each other directly, or make physical or electrical contact with each other indirectly, and can also be used to indicate that two or more elements cooperate or interact with each other.

First Embodiment

Figure 1:
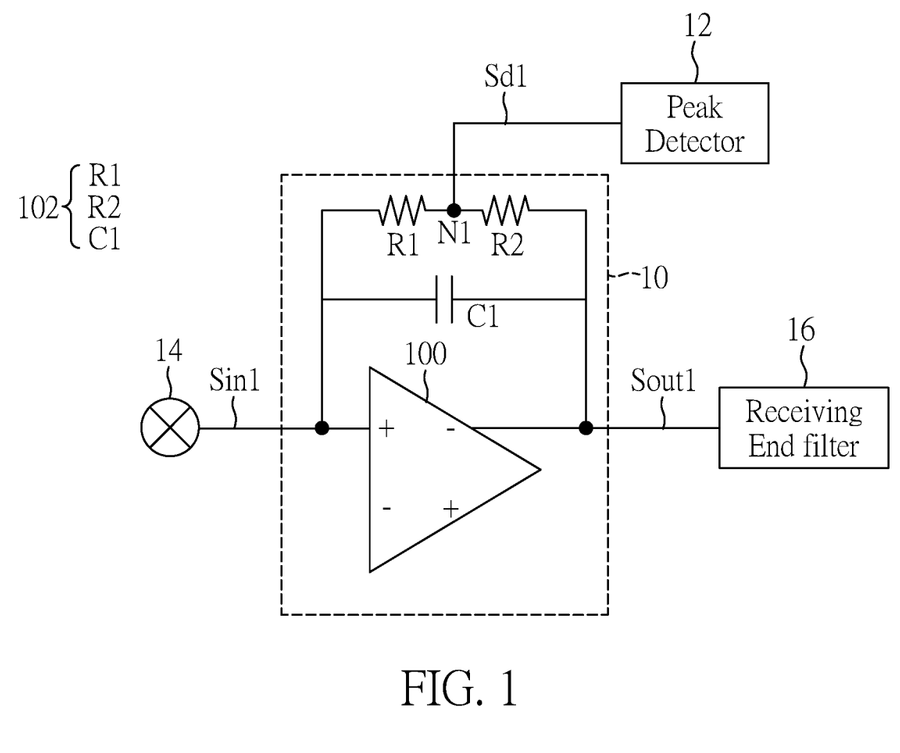
FIG. 1 is a circuit layout diagram of a signal adjusting circuit according to a first embodiment of the present disclosure.

FIG. 1 is a circuit layout diagram of a signal adjusting circuit according to a first embodiment of the present disclosure.

Referring to FIG. 1, the first embodiment of the present disclosure provides a signal adjusting circuit 10 adapted to a peak detector 12. The signal adjusting circuit 10 includes a first amplifier 100 and a first feedback circuit 102.

The first amplifier 100 has a first input terminal (a positive (+) terminal on the left), a second input terminal (a negative (−) terminal on the left), a first output terminal (a negative (−) terminal on the right), and a second output terminal (a positive (+) terminal on the right). The first input terminal receives a first input signal Sin1, and the first amplifier 100 is configured to amplify the first input signal Sin1 and output a first output signal Sout1 from the first output terminal.

The first feedback circuit 102 includes a capacitor C1, a resistor R1, and a resistor R2. The capacitor C1 is connected between the first input terminal and the first output terminal. One end of the resistor R1 is connected to the first input terminal, and another end of the resistor R1 is connected to a first output node N1. The resistor R2 is connected between the first output node N1 and the first output terminal. The first feedback circuit 102 is configured to determine a first gain of the first output signal Sout1.

In the present embodiment, the signal adjusting circuit 10 can be used as a half circuit of a transimpedance amplifier (TIA), and can be connected between a frequency mixer 14 and a receiving end filter 16. The TIA is suitable for a differential transmission scheme, and thus further includes another half circuit that has a circuit structure symmetrical to the signal adjusting circuit 10. Therefore, it is obvious that the first input terminal is connected to the frequency mixer 14 to receive the first input signal Sin1, and the first output terminal is connected to the receiving end filter 16 to output the first output signal Sout1.

In addition, the peak detector 12 is connected to the first output node N1 to receive a first detection signal Sd1 and detect a peak value of the first detection signal Sd1. It should be noted that the peak detector 12 can convert an AC signal into a DC voltage level, and then transmit the DC voltage level to a comparator circuit for comparison. Therefore, in response to the first detection signal Sd1 exceeding a preset voltage value, the comparator circuit can output a high level signal for detecting whether the first detection signal Sd1 is within a predetermined power input range. The resistor R1 and the resistor R2 can be designed to have a first predetermined ratio, so as to match an overall gain of the TIA (i.e., the aforementioned first gain) and select an appropriate intermediate gain. Accordingly, an appropriate first detection signal Sd1 can be provided to the peak detector 12. In other words, resistance values of the resistor R1 and the resistor R2 that have the first predetermined ratio can enable the first detection signal Sd1 to have a second gain relative to the first input signal Sin1 and to be within the predetermined power input range of the peak detector 12.

In addition, it should be noted that the first gain (hereinafter referred to as Gain1) is determined according to an equivalent impedance (hereinafter referred to as Rmix) of a front-end circuit that includes the frequency mixer 14, and the resistance values of the resistors R1 and R2.

An example illustrating how the resistance values of the resistors R1 and R2 are determined will be provided below.

In a case where a peak detector is to be set at an output terminal of the TIA, a predetermined power input range of the peak detector is +10 dBm, and the overall gain (Gain1) of the TIA is 28 dB, it is necessary to equivalently provide the first detection signal Sd1 with a second gain (hereinafter referred to as Gain2) of 18 dB at the first output node N1.

Therefore, selecting an appropriate ratio of the resistors R1 and R2 to satisfy the following equations (1) and (2) is required:

$$\text{Gain1} = \frac{R1 + R2}{Rmix}; \quad \text{equation (1)}$$

$$\text{Gain2} = 18 \text{ dB} = 20 * \log\left(\frac{R1}{Rmix}\right); \quad \text{equation (2)}$$

Assuming that the equivalent impedance Rmix observed from the TIA to a side of the frequency mixer 14 is 400 Ohm, the resistance values of the resistors R1 and R2 can be obtained from the following equations (3)-(5):

$$R1 + R2 = 10^{\left(\frac{28}{20}\right)} * Rmix = 10.048 \text{ kOhm}; \quad \text{equation (3)}$$

$$R1 = 10^{\left(\frac{18}{20}\right)} * Rmix = 3.177 \text{ kOhm}; \quad \text{equation (4)}$$

$$R2 = 10.048 - 3.177 = 6.871 \text{ kOhm}. \quad \text{equation (5)}$$

It can be observed from the above equations that the signal adjusting circuit 10 provided by the present disclosure can design the resistance values of the resistors R1 and R2 for the TIA, such that the first detection signal Sd1 can be provided with an appropriate second gain relative to the first input signal Sin1, and can be within the predetermined power input range of the peak detector 12.

Figure 2A:
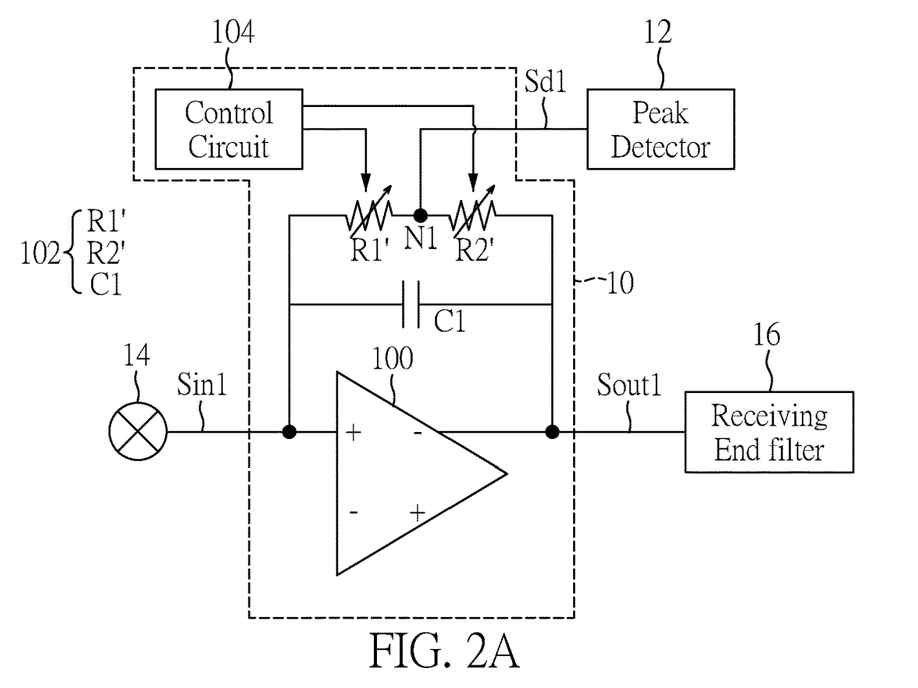
FIG. 2A is another circuit layout diagram of the signal adjusting circuit according to the first embodiment of the present disclosure.
Figure 2B:
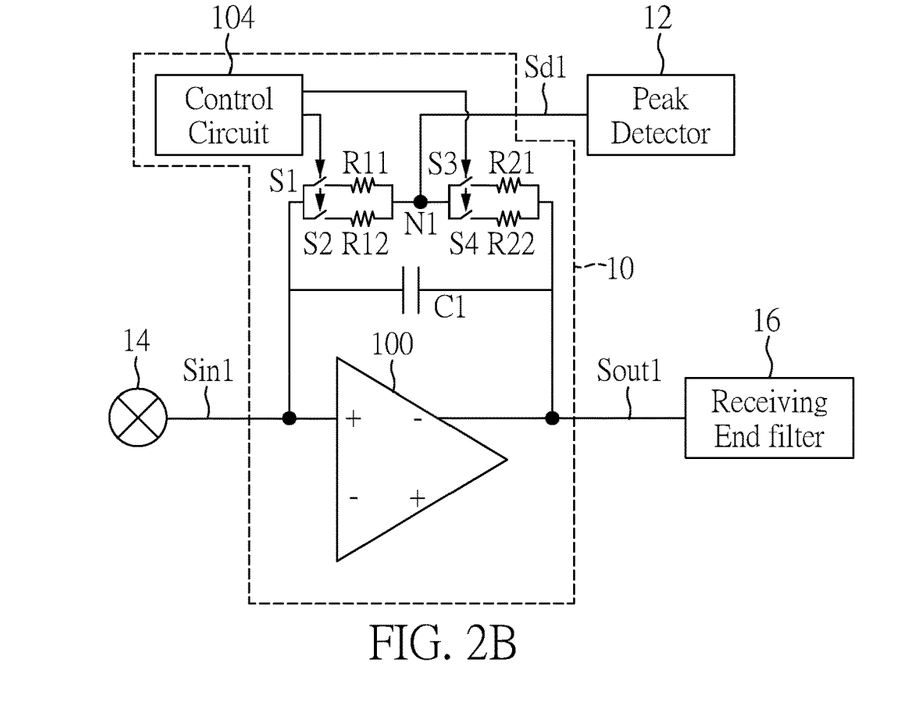
FIG. 2B is yet another circuit layout diagram of the signal adjusting circuit according to the first embodiment of the present disclosure.

FIG. 2A is another circuit layout diagram of the signal adjusting circuit according to the first embodiment of the present disclosure, and FIG. 2B is yet another circuit layout diagram of the signal adjusting circuit according to the first embodiment of the present disclosure.

In the embodiment of FIG. 2A, the resistor R1 can be replaced with a variable resistor R1', and the resistor R2 can be replaced with a variable resistor R2'. The signal adjusting circuit 10 further includes a control circuit 104, which is configured to control the first gain and the second gain by controlling resistance values of the first variable resistor R1' and the second variable resistor R2', such that the first detection signal Sd1 remains within the predetermined power input range in response to the first output signal Sout1 being changed.

In addition, as shown in FIG. 2B, the variable resistor R1' includes switches S1, S2 and resistors R11, R12 with different resistance values, and the switches S1, S2 are respectively connected in series with the resistors R11, R12. Similarly, the variable resistor R2' includes switches S3 and S4 and resistors R21 and R22 with different resistance values, and the switches S3 and S4 are respectively connected in series with the resistors R21 and R22.

In this embodiment, the control circuit 104 is configured to control the switches S1, S2, S3, and S4 to be turned on or off, so as to determine the first gain and the second gain.

For example, if the TIA can switch to have different overall gains (i.e., first gains), appropriate resistance values of the resistors R1 and R2 can be designed to be adapted to the same peak detector 12. In other words, the first detection signal Sd1 can be within the same predetermined power input range, and there is no need to use different peak detectors 12 or to add additional preamplifiers or attenuators.

The following example is made with reference to the signal adjusting circuit of FIGS. 2A and 2B.

In a case where the peak detector is to be set at the output terminal of the TIA, the predetermined power input range of the peak detector is +10 dBm, and the overall gain (Gain1) of the TIA can be switched between 28 dB and 22 dB, it is necessary to equivalently provide the first detection signal Sd1 with second gains (hereinafter referred to as Gain2) of 18 dB and 12 dB at the first output node N1.

Based on the above conditions, the resistance values of the resistors R1 and R2 that need to be used in response to the second gain being 18 dB and 12 dB can be calculated according to the above equations (1)-(5). Then, the resistance values of the resistors R1 and R2 that need to be used can be controlled by the control circuit 104, such that the second gain can be correspondingly adjusted after the first output signal Sout1 is changed due to gain adjustment, thereby providing the first detection signal Sd1 that is still within the predetermined power input range. Therefore, there is no need to use a different peak detector 12 or to add an additional preamplifier or attenuator.

Second Embodiment

Figure 3:
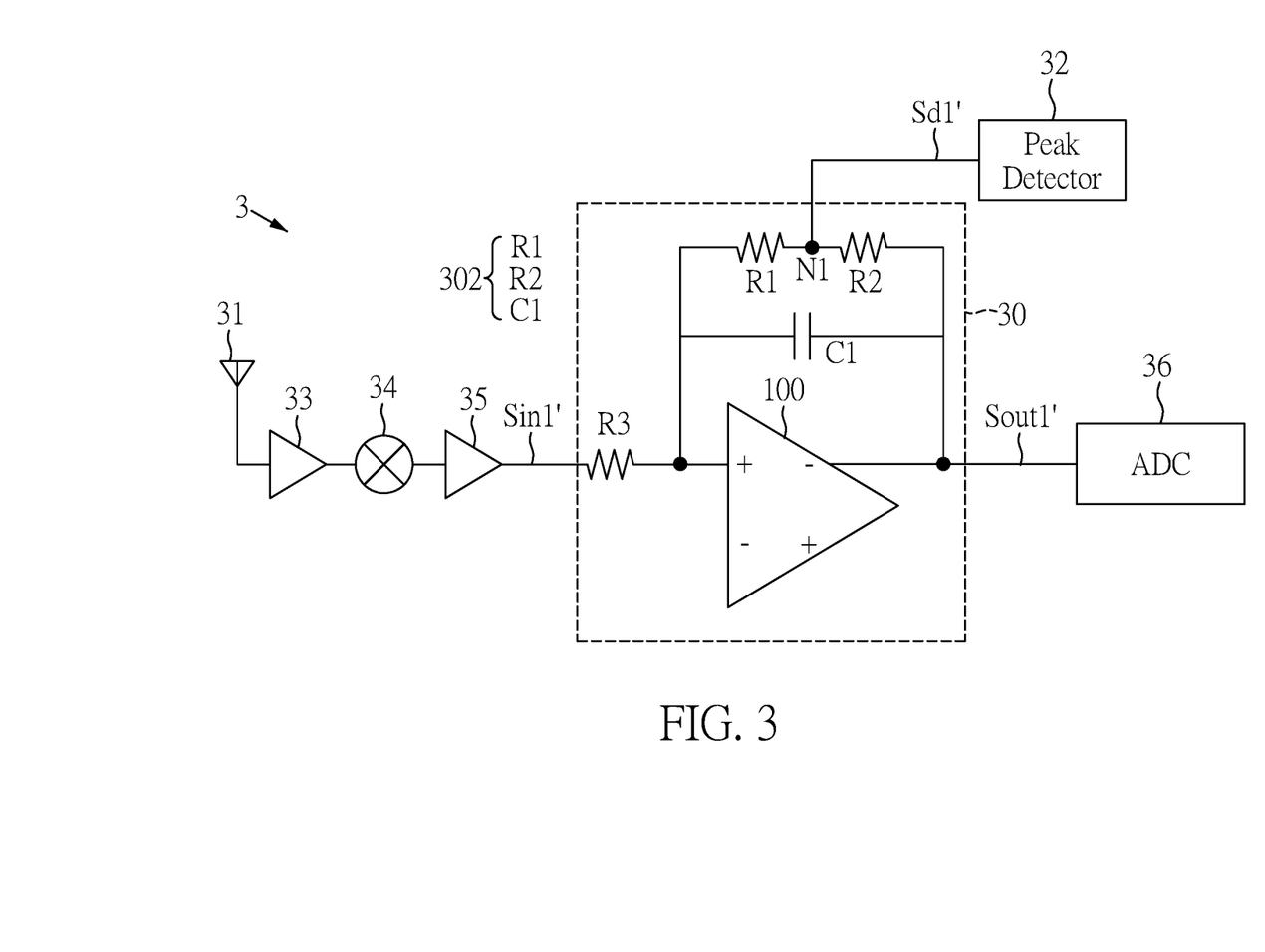
FIG. 3 is a circuit layout diagram showing the signal adjusting circuit being applied to a receiving end circuit according to a second embodiment of the present disclosure.

FIG. 3 is a circuit layout diagram showing the signal adjusting circuit being applied to a receiving end circuit according to a second embodiment of the present disclosure.

Referring to FIG. 3, the second embodiment of the present disclosure provides a signal adjusting circuit 30, which is adapted to a peak detector 32. The signal adjusting circuit 30 includes a first amplifier 300 and a first feedback circuit 302, and the first feedback circuit 302 includes a capacitor C1, and resistors R1 and R2. It should be noted that a structure of the signal adjusting circuit 30 is basically the same as that of the signal adjusting circuit 10 in FIG. 1, details of which will not be reiterated herein.

The difference is that the signal adjusting circuit 30 of FIG. 3 further includes a resistor R3. One end of the resistor R3 is used for receiving a first input signal Sin1', and another end of the resistor R3 is connected to a first input terminal (a positive (+) terminal on the left) of the first amplifier 300.

It should be noted that the signal adjusting circuit 30 of the present embodiment is applied to the receiving end circuit 3. The receiving end circuit 3 also includes an antenna 31, the peak detector 32, a low noise amplifier (LNA) 33, a frequency mixer 34, a transimpedance amplifier 35, and an analog-to-digital converter (ADC) 36. The signal adjusting circuit 30 can be, for example, a half circuit of a receiving end baseband filter (Rx baseband filter), and is connected between the transimpedance amplifier 35 and the ADC 36. Similarly, in order to be adapted to the differential transmission scheme, the receiving end baseband filter also includes another half circuit that has a circuit structure symmetrical to the signal adjusting circuit 30.

In this embodiment, an overall gain (first gain Gain1) of the receiving end baseband filter is determined according to resistance values of the resistors R1, R2, and R3, as shown in the following equation (6):

$$\text{Gain1} = \frac{R1 + R2}{R3}. \quad \text{equation (6)}$$

In addition, it should be noted that the resistors R1 and R2 in this embodiment can be similar to what is shown in FIG. 2A (in which the control circuit is utilized to control the variable resistor), or can be similar to what is shown in FIG. 2B (in which the control circuit is utilized to switch the switches). However, the present disclosure is not limited thereto.

An example is given below to illustrate a manner of determining the resistance values of the resistors R1 and R2 in the present embodiment.

In a case where a peak detector is to be set at an output terminal of the receiving end baseband filter, a predetermined power input range of the peak detector is +10 dBm, and the overall gain (Gain1) of the receiving end baseband filter is 24 dB, it is necessary to equivalently provide the first detection signal Sd1 with a second gain (hereinafter referred to as Gain2) of 14 dB at the first output node N1, such that the first detection signal Sd1' inputted to the peak detector 32 is 0 dBm.

Assuming that the resistance value of the resistor R3 is 1 kOhm, a sum of the resistors R1 and R2 can be calculated by the equation (6), as shown in the following equation (7):

$$R1 + R2 = 10^{\left(\frac{24}{20}\right)} * R3 = 15.849 \text{ kOhm}. \quad \text{Equation (7)}$$

Next, it is necessary to select an appropriate ratio of the resistors R1 and R2 to keep the first detection signal Sd1' of the input peak detector 32 to be 0 dBm, so that the peak detector set at the output terminal of the receiving end baseband filter receives a +10 dBm signal in an equivalent manner. Therefore, the resistance values of the resistors R1 and R2 can be obtained by the following equation (8)-(10):

$$\text{Gain2} = \frac{R1}{R3} = 0 - (10 - 24) = +14 \text{ dB}; \quad \text{equation (8)}$$

$$R1 = 10^{\left(\frac{14}{20}\right)} * R3 = 5.011 \text{ k Ohm}; \quad \text{equation (9)}$$

$$R2 = 15.849 - 5.011 = 10.838 \text{ k Ohm}. \quad \text{equation (10)}$$

It can be observed from the above equations that the signal adjusting circuit 10 provided by the present disclosure can be used in the receiving end circuit 3, and the resistance values of the resistors R1 and R2 can be designed for the receiving end baseband filter, such that the first detection signal Sd1' can be provided with an appropriate second gain relative to the first input signal Sin1, and can be within the predetermined power input range of the peak detector 12.

Third Embodiment

Figure 4:
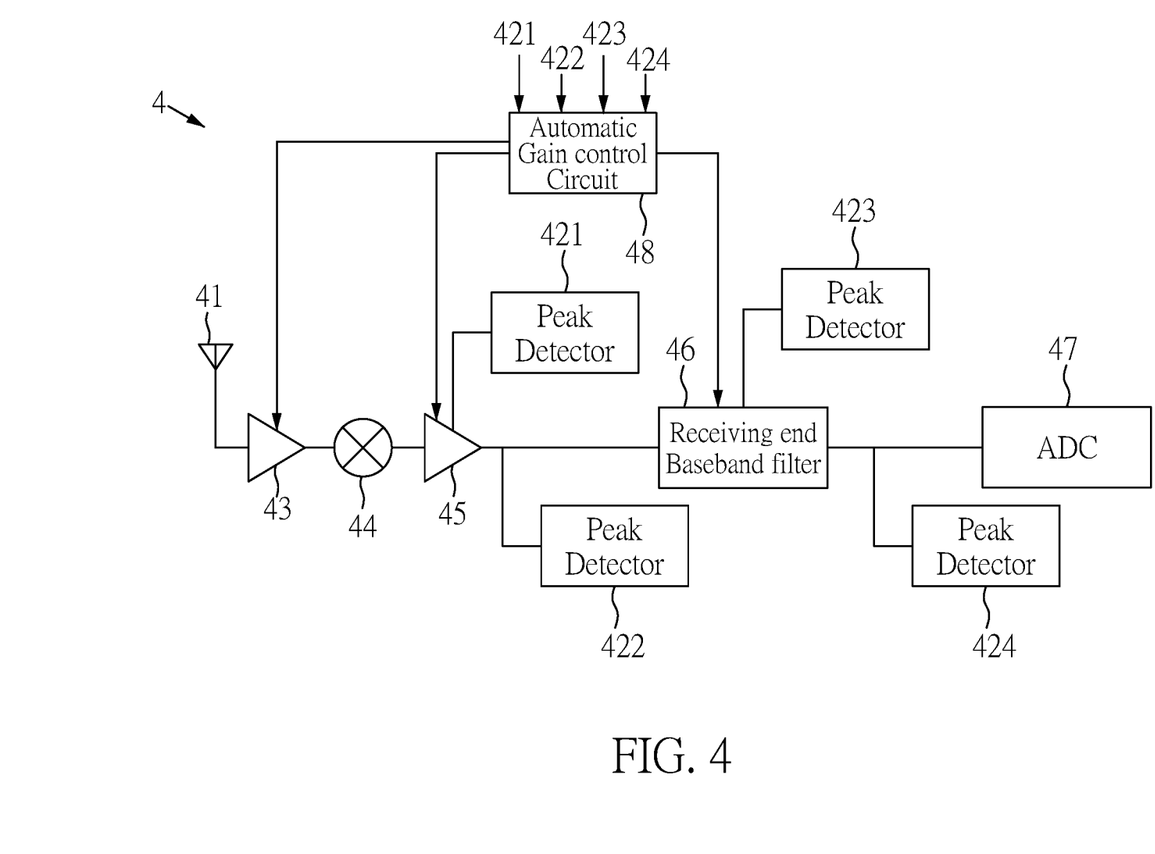
FIG. 4 is a block diagram of the receiving end circuit according to a third embodiment of the present disclosure.
Figure 5:
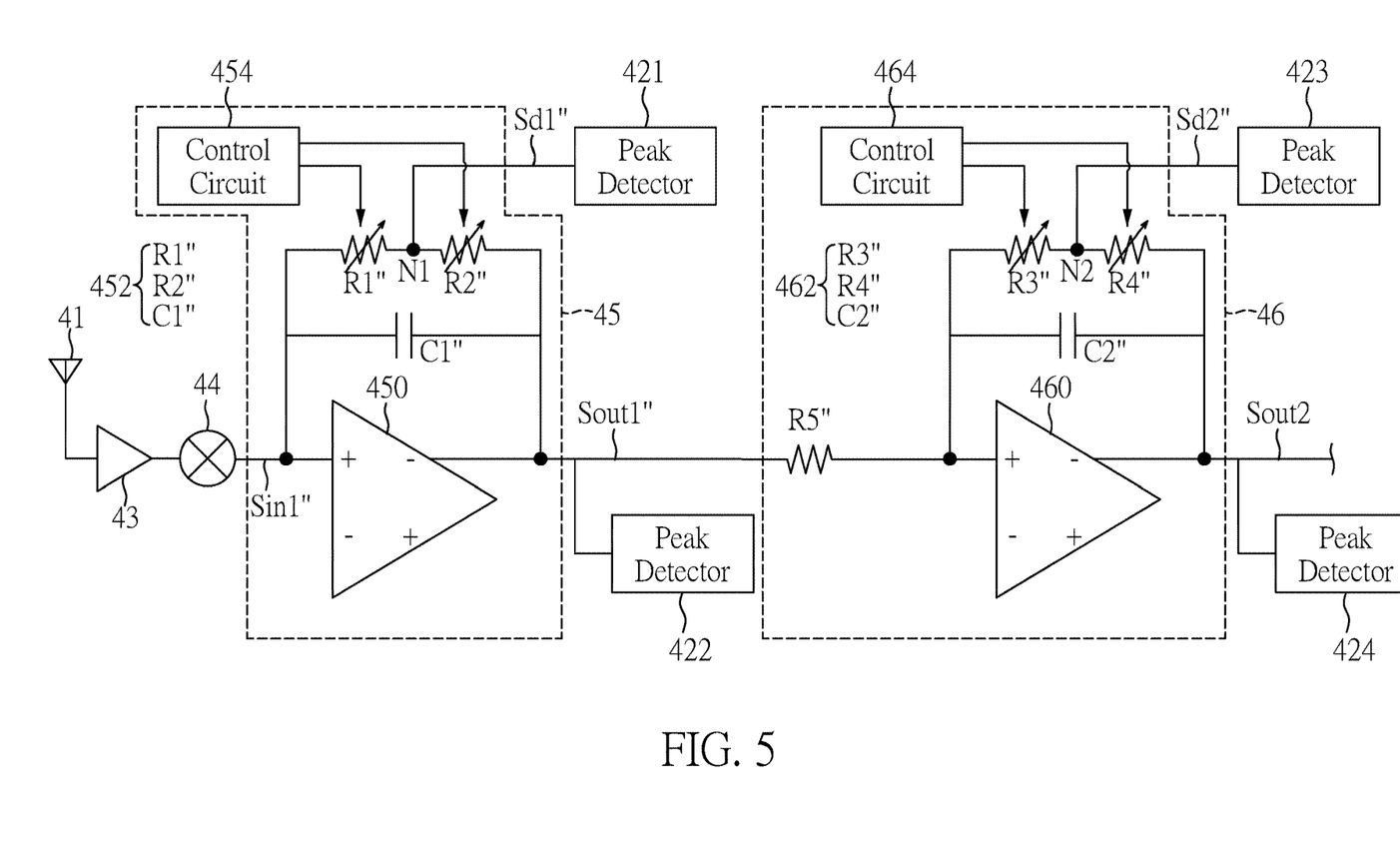
FIG. 5 is a circuit structure diagram of a transimpedance amplifier and a receiving end baseband filter of the receiving end circuit according to the third embodiment of the present disclosure.

FIG. 4 is a block diagram of the receiving end circuit according to a third embodiment of the present disclosure, and FIG. 5 is a circuit structure diagram of a transimpedance amplifier and a receiving end baseband filter of the receiving end circuit according to the third embodiment of the present disclosure.

Referring to FIG. 4, the third embodiment of the present disclosure provides a receiving end circuit 4, which includes an antenna 41, peak detectors 421, 422, 423, 424, an LNA 43, a frequency mixer 44, a transimpedance amplifier 45, a receiving end baseband filter 46, an ADC 47, and an automatic gain control circuit 48.

As shown in FIG. 5, a half circuit of the transimpedance amplifier 45 is connected to the frequency mixer 44, and a half circuit of the receiving end baseband filter 46 is connected to the half circuit of the transimpedance amplifier 45. Similarly, in order to be adapted to the differential transmission scheme, the transimpedance amplifier 45 and the receiving end baseband filter 462 each include another half circuit that has a symmetrical circuit structure.

The transimpedance amplifier 45 includes the signal adjusting circuit mentioned in the foregoing embodiments (such as the signal adjusting circuit 10 of FIG. 2A), which includes an amplifier 450, a feedback circuit 452, and a control circuit 454. The amplifier 450 is configured to amplify a first input signal Sin1" and output a first output signal Sout1". The feedback circuit 452 includes a capacitor C1", and variable resistors R1" and R2". The amplifier 450 and the feedback circuit 452 are the same as the circuit structure of FIG. 2A, details of which will not be reiterated herein.

The control circuit 454 is configured to control the variable resistors R1" and R2", so as to determine a first gain of the first output signal Sout1" relative to the first input signal Sin1", and a second gain of a first detection signal Sd1" relative to the first input signal Sin1". The peak detector 421 is connected to the first output node N1 to receive the first detection signal Sd1", and the peak detector 421 has a first predetermined power input range and is configured to detect a peak value of the first detection signal Sd1". Similarly, the control circuit 454 controls resistance values of the variable resistors R1" and R2" to have a first predetermined ratio, such that the first detection signal Sd1" is within the first predetermined power input range.

The receiving end baseband filter 46 includes a second signal adjusting circuit, which includes a resistor R5", an amplifier 460, and a feedback circuit 462. The resistor R5" has one end connected to a first input terminal of the amplifier 460. The amplifier 460 is configured to amplify the first output signal Sout1" and output a second output signal Sout2. The feedback circuit 462 includes a capacitor C2", and variable resistors R3" and R4". The amplifier 460 and the feedback circuit 462 are the same as the circuit structure of FIG. 2A, details of which are not reiterated herein.

A control circuit 464 is configured to control the variable resistors R3" and R4", so as to determine a third gain of the second output signal Sout2 relative to the first output signal Sout1", and a fourth gain of a second detection signal Sd2" relative to the first output signal Sout1". The peak detector 423 is connected to a second output node N2 to receive the second detection signal Sd2", and the peak detector 423 has a second predetermined power input range and is configured to detect a peak value of the second detection signal Sd2". Similarly, the control circuit 464 controls the resistance values of the variable resistors R3" and R4" to have a second predetermined ratio, such that the second detection signal Sd2" is within the second predetermined power input range. In another embodiment, the control circuit 454 and the control circuit 464 can be integrated in one control circuit to control the resistance values of the variable resistors R1", R2", R3" and R4", but the present disclosure is not limited thereto.

In the receiving end circuit 4, the LNA 43 is gain-adjustable. The LNA 43 receives and amplifies received signals from the antenna, and provides and inputs receiving end signals to the frequency mixer 44. The frequency mixer 44 is connected to the LNA 43 and the transimpedance amplifier 45, so as to perform a mixing process on the receiving end signal and provide the first input signal Sin1" with reduced frequency to the transimpedance amplifier 45. The ADC is connected to the receiving end baseband filter 46 to receive the second output signal Sout2, and converts the second output signal Sout2 to generate a digital signal.

The automatic gain control circuit 48 of the receiving end circuit 4 is connected to the control circuits 454, 464, the peak detectors 421, 422, 423, 424, and the LNA 43, and is configured to control the control circuits 454, 464 and LNA 43 according to detection results of the peak detectors 421, 422, 423, 424.

In more detail, in this embodiment, the peak detectors 421, 422, 423, and 424 are, for example, 1-bit peak detectors, which only output high and low levels to represent the detection results. In the present embodiment, the peak detectors 421 and 423 are designed to detect output powers of +10 dBm of the transimpedance amplifier 45 and the receiving end baseband filter. In other embodiments, the peak detector can be implemented by a multi-bit peak detector, but the present disclosure is not limited thereto.

In this embodiment, when the detection results of the peak detectors 421 and 423 are both at a high level, it means that the gains of the signals are too large and need to be adjusted with a greater level. For example, the gain automatic control circuit 48 can be configured to adjust overall gains of the LNA 43 and the receiving end baseband filter 46 in response to receiving the detection results. How the overall gain of the receiving end baseband filter 46 can be adjusted is already described in the above-mentioned embodiment, and will not be reiterated herein.

When the detection result of the peak detector 421 is at a high level and the detection result of the peak detector 423 is at a low level, it means that coexistence interference may occur at this time and there is a larger out-of-band spur. Then, in response to obtaining such detection results, the gain automatic control circuit 48 can be configured to correspondingly reduce the overall gain of the LNA 43 and the transimpedance amplifier 45. How the overall gain of the transimpedance amplifier 45 can be adjusted is already described in the above-mentioned embodiment, will not be reiterated herein.

When the detection result of the peak detector 421 is at a low level and the detection result of the peak detector 423 is at a high level, or when the detection results of the peak detectors 421 and 423 are both at a low level, it means that the overall gain of the receiving end baseband filter 46 needs to be fine-tuned, so as to adjust an output power of the receiving end baseband filter 46 to be within a proper range.

Furthermore, if more peak detectors are provided (e.g., the peak detectors 422 and 424 of FIG. 5), the gain can be adjusted more accurately according to the detection results. For example, in response to the peak detector 422 outputting the high level, an input power of the LNA is suggested to be larger than a specific power. In addition, based on information of the peak detectors 422 and 424, it can be determined at which power level the input power of the LNA 43 is. In this way, the gain automatic adjusting circuit 48 can control the control circuits 454, 464 and the LNA 43 to quickly switch to a suitable gain.

Beneficial Effects of the Embodiments

In conclusion, the signal adjusting circuit and the receiving end circuit using the same provided by the present disclosure can cooperate with the transimpedance amplifier or a baseband filter in the receiving end circuit, and can be adapted to a receiving end peak detector without an area increase and use of an additional attenuator or preamplifier. In this way, mismatches caused by use of the above-mentioned additional components can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A signal adjusting circuit adapted to a peak detector, the signal adjusting circuit comprising:
   a first amplifier including a first input terminal and a first output terminal, wherein the first input terminal receives a first input signal, and the first amplifier is configured to amplify the first input signal and output a first output signal from the first output terminal; and
   a first feedback circuit, including:
      a first capacitor connected between the first input terminal and the first output terminal;
      a first resistor connected between the first input terminal and a first output node; and
      a second resistor connected between the first output node and the first output terminal, wherein the first feedback circuit is configured to determine a first gain of the first output signal;
   wherein the peak detector is connected to the first output node, so as to receive a first detection signal and detect a peak value of the first detection signal;
   wherein the peak detector has a predetermined power input range, and the first resistance and the second resistance have a first predetermined ratio, such that the first detection signal has a second gain relative to the first input signal and is within the predetermined power input range.

2. The signal adjusting circuit according to claim 1, wherein the signal adjusting circuit serves as a first half circuit of a first transimpedance amplifier and is connected between a mixer and a receiving end filter, and the first transimpedance amplifier further includes a second half circuit that has a circuit structure symmetrical to the first half circuit, so as to be suitable for a differential transmission scheme.

3. The signal adjusting circuit according to claim 2, wherein the first gain is determined according to the first resistor, the second resistor, and a first equivalent impedance of a front-end circuit that includes the mixer.

4. The signal adjusting circuit according to claim 2, wherein the first input terminal is connected to the mixer to receive the first input signal, and the first output terminal is connected to the receiving end filter to output the first output signal.

5. The signal adjusting circuit according to claim 1, wherein the first resistor is a first variable resistor, the second resistor is a second variable resistor, and the signal adjusting circuit further comprises a control circuit, which is configured to control the first gain and the second gain by controlling resistance values of the first variable resistor and the second variable resistor, such that the first detection signal remains within the predetermined power input range after the first output signal is changed.

6. The signal adjusting circuit according to claim 5, wherein the first variable resistor includes a plurality of first switches and a plurality of third resistors with different resistance values, and the plurality of first switches are respectively connected in series with the plurality of third resistors;
   wherein the second variable resistor includes a plurality of second switches and a plurality of fourth resistors with different resistance values, and the plurality of second switches are respectively connected in series with the plurality of fourth resistors;

wherein the control circuit is configured to control the plurality of first switches and the plurality of second switches to be turned on or off, so as to determine the first gain and the second gain.

7. The signal adjusting circuit according to claim 1, further comprising a fifth resistor, wherein one end of the fifth resistor is used for receiving the first input signal, and another end of the fifth resistor is connected to the first input terminal.

8. The signal adjusting circuit according to claim 7, wherein the signal adjusting circuit serves as a third half circuit of a receiving end baseband filter and is connected between a second transimpedance amplifier and an analog-to-digital converter, and the receiving end baseband filter also includes a fourth half circuit that has a circuit structure symmetrical to the third half circuit, so as to be suitable for a differential transmission scheme.

9. The signal adjusting circuit according to claim 8, wherein the first gain is determined according to resistance values of the first resistor, the second resistor, and the fifth resistor.

10. A receiving end circuit, comprising:
a transimpedance amplifier, including:
a first signal adjusting circuit, including:
a first amplifier including a first input terminal and a first output terminal, wherein the first input terminal receives a first input signal, and the first amplifier is configured to amplify the first input signal and output a first output signal from the first output terminal;
a first feedback circuit, including:
a first capacitor connected between the first input terminal and the first output terminal;
a first variable resistor connected between the first input terminal and a first output node; and
a second variable resistor connected between the first output node and the first output terminal; and
a first control circuit configured to control resistance values of the first variable resistor and the second variable resistor, so as to determine a first gain of the first output signal relative to the first input signal and a second gain of a first detection signal relative to the first input signal; and
a first peak detector, wherein the first peak detector is connected to the first output node to receive the first detection signal, has a first predetermined power input range, and is configured to detect a peak value of the first detection signal; wherein the first control circuit controls the resistance values of the first variable resistor and the second variable resistor to have a first predetermined ratio, such that the first detection signal is within the first predetermined power input range.

11. The receiving end circuit according to claim 10, further comprising:
a receiving end baseband filter, including:

a second signal adjusting circuit, including:
a first resistor having one end connected to the first output terminal;
a second amplifier including a second input terminal and a second output terminal, wherein the second input terminal is connected to the first output terminal through the first resistor to receive the first output signal, and the second amplifier is configured to amplify the first output signal and output a second output signal from the second output terminal;
a second feedback circuit, including:
a second capacitor connected between the second input terminal and the second output terminal;
a third variable resistor connected between the second input terminal and a second output node; and
a fourth variable resistor connected between the second output node and the second output terminal, wherein the second feedback circuit is configured to determine a third gain of the second output signal relative to the first output signal; and
a second control circuit configured to control resistance values of the third variable resistor and the fourth variable resistor, so as to determine a second gain of a second detection signal relative to the first output signal; and
a second peak detector, wherein the second peak detector is connected to the second output node to receive the second detection signal, has a second predetermined power input range, and is configured to detect a peak value of the second detection signal; wherein the second control circuit controls the resistance values of the third variable resistor and the fourth variable resistor to have a second predetermined ratio, such that the second detection signal is within the second predetermined power input range.

12. The receiving end circuit according to claim 11, further comprising:
a low noise amplifier configured to provide a receiving end signal; and
a mixer connected between the low noise amplifier and the transimpedance amplifier, so as to perform a mixing process on the receiving end signal and provide the first input signal.

13. The receiving end circuit according to claim 11, further comprising an automatic gain control circuit, wherein the automatic gain control circuit is connected to the first control circuit, the second control circuit, the first peak detector, and the second peak detector, and is configured to control the first control circuit and the second control circuit according to detection results of the first peak detector and the second peak detector.

* * * * *